(12) United States Patent
Sewani et al.

(10) Patent No.: US 9,214,941 B2
(45) Date of Patent: Dec. 15, 2015

(54) INPUT/OUTPUT CIRCUITS AND METHODS OF IMPLEMENTING AN INPUT/OUTPUT CIRCUIT

(71) Applicant: Xilinx, Inc., San Jose, CA (US)

(72) Inventors: Aman Sewani, Sunnyvale, CA (US); Parag Upadhyaya, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 218 days.

(21) Appl. No.: 14/014,879

(22) Filed: Aug. 30, 2013

(65) Prior Publication Data

US 2015/0061756 A1    Mar. 5, 2015

(51) Int. Cl.
*H03K 19/0185* (2006.01)
*H03K 19/177* (2006.01)

(52) U.S. Cl.
CPC .... *H03K 19/018521* (2013.01); *H03K 19/1778* (2013.01); *H03K 19/17744* (2013.01); *H03K 19/17788* (2013.01)

(58) Field of Classification Search
CPC ................ H03K 19/018585; H03K 19/17784; H03K 17/17788
USPC ............... 326/38, 80, 81, 83, 86, 90; 327/538
See application file for complete search history.

(56) References Cited

U.S. PATENT DOCUMENTS

| | | | |
|---|---|---|---|
| 5,877,632 A * | 3/1999 | Goetting et al. | 326/50 |
| 5,969,563 A * | 10/1999 | Shih et al. | 327/333 |
| 6,188,243 B1 * | 2/2001 | Liu et al. | 326/81 |
| 6,433,579 B1 | 8/2002 | Wang et al. | |
| 6,879,191 B2 * | 4/2005 | Davis | 327/112 |
| 6,924,659 B1 | 8/2005 | Andrews et al. | |
| 7,245,144 B1 | 7/2007 | Wong et al. | |
| 7,265,586 B1 | 9/2007 | Zhou et al. | |
| 8,332,550 B1 | 12/2012 | Young et al. | |

FOREIGN PATENT DOCUMENTS

EP    1 850 483 A2    10/2007

* cited by examiner

*Primary Examiner* — Daniel D Chang
(74) *Attorney, Agent, or Firm* — John J. King

(57) ABSTRACT

An input/output circuit implemented in an integrated circuit is described. The input/output circuit comprises an input/output pad and a voltage control circuit coupled to the input/output pad. The voltage control circuit sets a voltage at the input/output pad at a first voltage when the input/output pad is implemented as an input pad and at a second voltage when the input/output pad is implemented as an output pad. Methods of implementing input/output circuits in an integrated circuit are also described.

20 Claims, 9 Drawing Sheets

US 9,214,941 B2

INPUT/OUTPUT CIRCUITS AND METHODS OF IMPLEMENTING AN INPUT/OUTPUT CIRCUIT

TECHNICAL FIELD

The present invention relates generally to integrated circuit devices, and in particular, to input/output circuits and methods of implementing an input/output circuit.

BACKGROUND

Integrated circuits are an important element in wide variety of electronic devices. As with any product, there is always an effort to improve integrated circuit devices. Among other improvements, effort is often made to reduce the size of integrated circuits and increase the capacity of integrated. However, any reduction in the size of an integrated circuit or an increase in the capacity of the integrated circuit will make it more difficult to provide a sufficient number of input/output (I/O) pins. Data is transferred to or from an integrated circuit device by way of input/output pins on the device. As the complexity of integrated circuits increases, the requirement for input and output pins also increases. Efforts have also been made to improve the flexibility of integrated circuits. However, conventional integrated circuit devices do not provide flexibility for input/output circuits.

SUMMARY

An input/output circuit implemented in an integrated circuit is described. The input/output circuit comprises an input/output pad; and a voltage control circuit coupled to the input/output pad; wherein the voltage control circuit sets a voltage at the input/output pad at a first voltage when the input/output pad is implemented as an input pad and at a second voltage when the input/output pad is implemented as an output pad.

According to another implementation, an input/output circuit implemented in an integrated circuit comprises an input/output pad; a first switch coupled to a common mode voltage, the first switch enabling coupling the common mode voltage to the input/output pad when the input/output pad is implemented as an input pad; and a second switch coupled to a reference voltage, the second switch coupling the reference voltage to the input/output pad when the input/output pad is implemented as an output pad.

A method of implementing an input/output circuit in an integrated circuit is also disclosed. The method comprises providing an input/output pad; coupling a common mode voltage to the input/output pad when the input/output pad is implemented as an input pad; and coupling to a reference voltage to the input/output pad when the input/output pad is implemented as an output pad.

DETAILED DESCRIPTION

Figure 1:
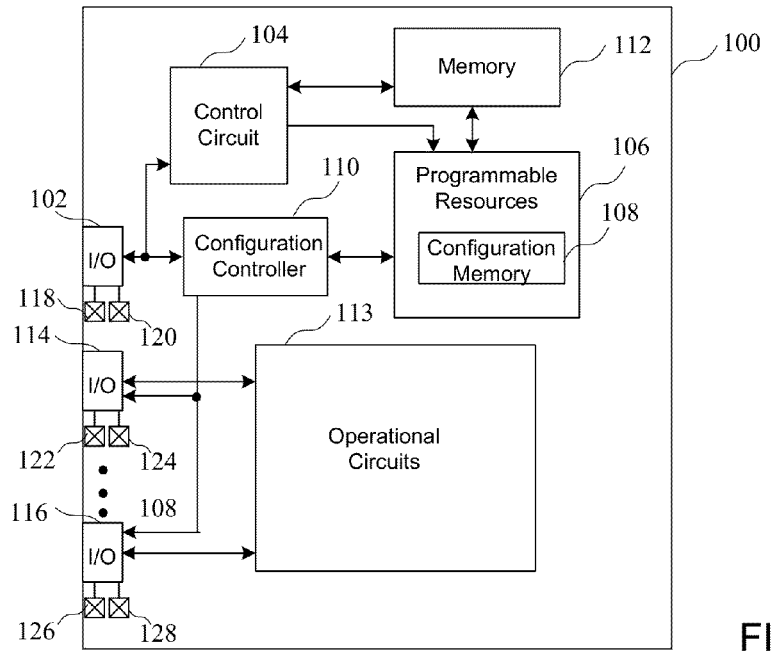
FIG. 1 is a block diagram of an integrated circuit device implementing input/output ports.

Turning now to FIG. 1, a block diagram of an integrated circuit device implementing input/output ports is shown. The circuit of FIG. 1 is implemented in an integrated circuit 100 having an input/output (I/O) circuit 102 coupled to a control circuit 104 and programmable resources 106. The programmable resources include circuit elements which are configurable by a user of the circuit to implement a circuit design of the user's choice. As will be described in more detail below, the programmable resources may include programmable logic, such as the programmable logic described in reference to FIGS. 11 and 12.

The circuits implemented in the programmable resources may be implemented according to a configuration bitstream downloaded to the integrated circuit 100. As will be described in more detail below, the programmable resources 106 include configuration memory 108. Generally, configuration memory 108 includes memory cells for configuring the programmable resources based upon configuration bits of the configuration bitstream. Although a single configuration resource block 106 and configuration memory 108 is shown, a given integrated circuit may include a plurality of blocks having configurable resources controlled by configuration memory. Also, the integrated circuit 100 may include a memory 112, such as a non-volatile memory external to the programmable resources, for storing configuration data.

The integrated circuit 100 may also include other operational circuits 113 coupled to input/output ports 114-116, for example. While the operational circuits 113 are shown separate from the operational circuits, it should be understood that the operational circuits could be a part of the programmable resources 106. All or some of the input/output circuits 102 and 114-116 may be coupled to memory elements. For example, input/output circuit 102 may be controlled by memory elements 118 and 120, input/output circuit 114 may be controlled by memory elements 122 and 124, and input/output circuit 116 may be controlled by memory elements 126 and 128. Although two memory elements are shown with each input/output circuit, it should be understood that a greater or lesser number of memory elements may be implemented, as will be described in more detail below. Further, while the input/output circuits are shown separate from the programmable resources 106 and the memory elements are shown separate from the configuration memory 108, it should be understood that the input/output circuits are programmable resources, and that the memory elements associated with the input/output circuits 102, 114, 116 could be a part of the configuration memory 108.

A configuration controller 110 may be implemented, as a part of or separate from the control circuit 104, to load the configuration data into the configuration memory 108. The configuration data may be loaded directly by the configuration controller 110 by way of the I/O port 102, or by way of the control circuit 104 and the memory 112. The circuit of FIG. 1 may be any device having programmable resources, such as a programmable logic device as described below, or an application-specific integrated circuit (ASIC) having a portion of circuits which is programmable, for example.

As will be described in more detail below, an architecture and circuit design achieves a unified bi-directional input/output circuit for alternating current (AC) coupled low voltage links. The circuit enables bi-directional clocking that supports large swings at the input and large programmable output swings. The circuit allows the same pin to be used to either receive an input signal or transmit an output signal at a 50 ohm impedance in AC coupled modes. Voltage stress issues presented in a low voltage environment (i.e., when input swing can be as large as 2.4 Vpp differential and output swings needs to support up to 800 mVpp differential swings from 1V supply) are also addressed.

One aspect of the circuit provides a configurable design where the same pins are used to receive or transmit data, eliminating the need to dedicate separate pins coupled to a receive buffer and a transmit driver is eliminated, and reducing hardware cost and pin usage. A user may program the circuit to establish whether the pins are used to receive data or transmit data, and may reuse the same hardware to receive or transmit data.

Figure 2:
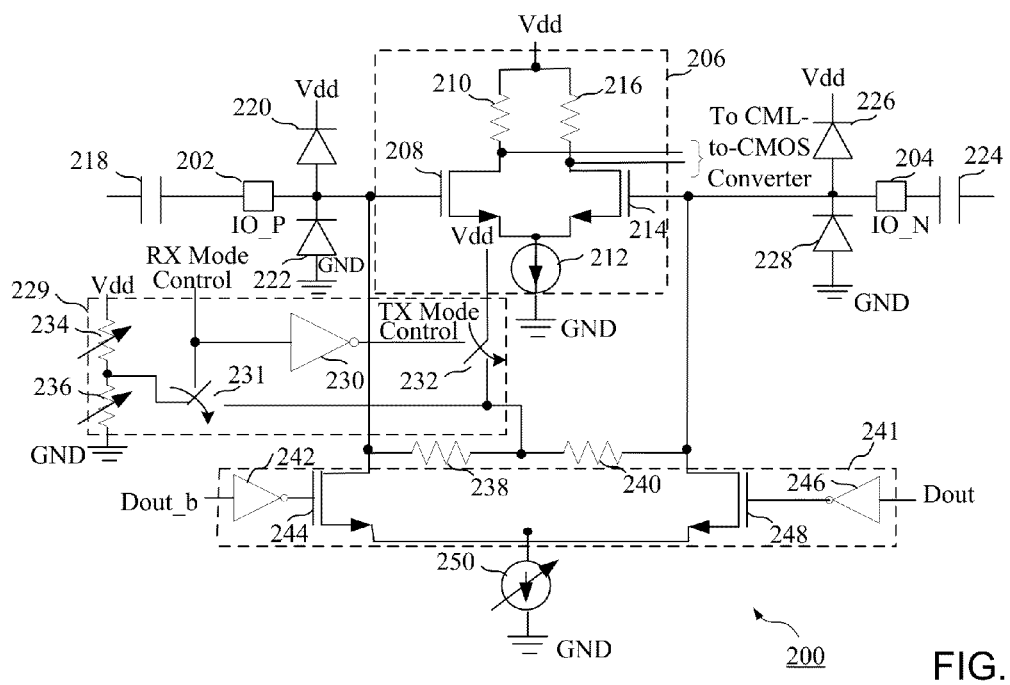
FIG. 2 is a block diagram of an input/output circuit.

As shown in FIG. 2, an input/output circuit 200, which could be implemented as one or more of input/output circuits 102, 114, or 116 for example, comprises a pair of input/output pads 202 (designated IO_P) and 204 (designated IO_N), each of which is coupled to a receive buffer 206. The receive buffer 206 comprises a first input transistor 208 having a gate coupled to the input pad 202, a drain coupled to a first pull-up resistor 210 (having a terminal coupled to a reference voltage Vdd), and a source coupled to a current source 212. The input/output pad 204 is coupled to a gate of a second input transistor 214 coupled between a second pull-up resistor 216 and the current source 212. An AC coupling capacitor 218, which may be an off-chip capacitor, and protection diodes 220 and 222 are also coupled to the input/output pad 202. Similarly, an AC coupling capacitor 224, which may also be an off-chip capacitor, and protection diodes 226 and 228 are coupled to the input/output pad 204.

A voltage control circuit 229 is coupled to control a voltage at the input/output pads 202 and 204. In particular, an inverter 230 and a control terminal of a switch 231 are coupled to receive a receive mode control signal (RX Mode Control), the inverted signal of which generated at the output of the inverter 230 is a transmit mode control signal (TX Mode Control) which is coupled to control a switch 232. A resistor divider network, comprising a first resistor 234 and a second resistor 236, is coupled to the switch 231 which passes the voltage generated at the node connecting the first resistor 234 and the second resistor 236. As will be described in more detail below, one or both of the first and second resistors 234 and 236 may be variable resistors to enable setting the common mode voltage at the node connecting the first and second resistors.

When the RX Mode Control signal is high, the switch 231 is closed to provide the common mode voltage to a node coupling first terminals of resistors 238 and 240, where the second terminal of resistor 238 is coupled to the input/output pad 202 and the second terminal of resistor 240 is coupled to the input/output pad 204. Accordingly, during the RX mode, resistor 238 functions as a pull-up resistor between a common mode voltage and the input/output pad 202 to pull the input/output pad to a predetermined DC voltage which provides an offset around which an input signal coupled to the I/O pad swings. For example, if the common mode voltage is 800 millivolts (mv) and the input swing is 1.2 volts, the AC coupled input signal would swing from 200 mv to 1.4 volts. Similarly, resistor 240 will function as a pull-up resistor between the common mode voltage and the input/output pad 204. The input signals coupled to the input/output pads 202 and 204 are coupled to the gates of transistors 208 and 214, respectively, of the input buffer 206. The outputs of the input buffer at the drains of the transistors 208 and 214 are coupled to a CML-to-CMOS converter circuit, which will be described in more detail below in reference to FIG. 6.

In the transmit mode, the RX Mode Control signal is low, generating a high TX mode control signal which closes the switch and couples the reference voltage Vdd to the node coupling resistors 238 and 240. The transmit driver circuit 241 which is configured to provide differential signals to be generated as output signals to the input/output pads 202 and 204. A transmit driver circuit 241 comprises an inverter 242 is coupled to receive the Dout_b signal, an inverted signal of which is coupled to the gate of the transistor 244 for generating a signal at the input/output pad 202. Similarly, an inverter 246 is coupled to receive the Dout signal, an inverted signal of which is coupled to the gate of the transistor 248 for generating a signal at the input/output pad 204. The inverters 242 and 246 are preferably skewed inverters, as will be described in more detail in reference to FIGS. 7 and 8. The current source 250 is coupled to the sources of the transistors 244 and 248, and is selectively turned on in the transmit mode and off in the receive mode. The gate of transistors 244 and 248 may be pulled high (i.e., Dout and Dout_b pulled low), where transistors 244 and 248 may be weakly on. However, because the current source 250 is off, the weakly-on transistors 244 and 248 will not hurt performance.

Figure 3:
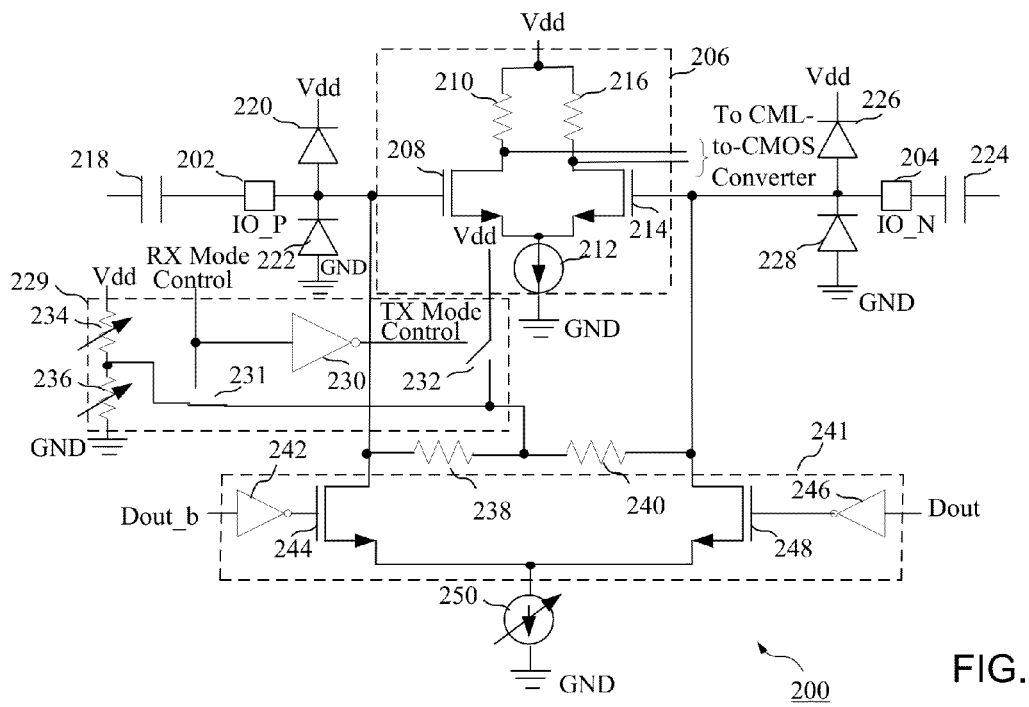
FIG. 3 is a block diagram showing the implementation of the input/output circuit of FIG. 2 configured to receive input signals.

The resistors 238 and 240 may be 50 ohm resistors that have a dual function of serving as a termination for the RX buffer and termination/load of the TX driver. In the receive mode as shown in FIG. 3, the switch 231 gated by RX Mode Control signal closes and the switch 232 gated by TX Mode Control signal opens. An input signal flows from the input/output pads 202 and 204 to the transistors 208 and 214, respectively, of the input buffer 206. A 100 ohms differential termination resistance provided by resistors 238 and 240 terminate the input path to mitigate issues with reflections. The transistors 208 and 214 of the input buffer 206 may be thick oxide NMOS devices transistors for stress protection and for improved CDM performance. The input stage implemented as a differential amplifier is followed by a CML-to-CMOS stage.

Figure 4:
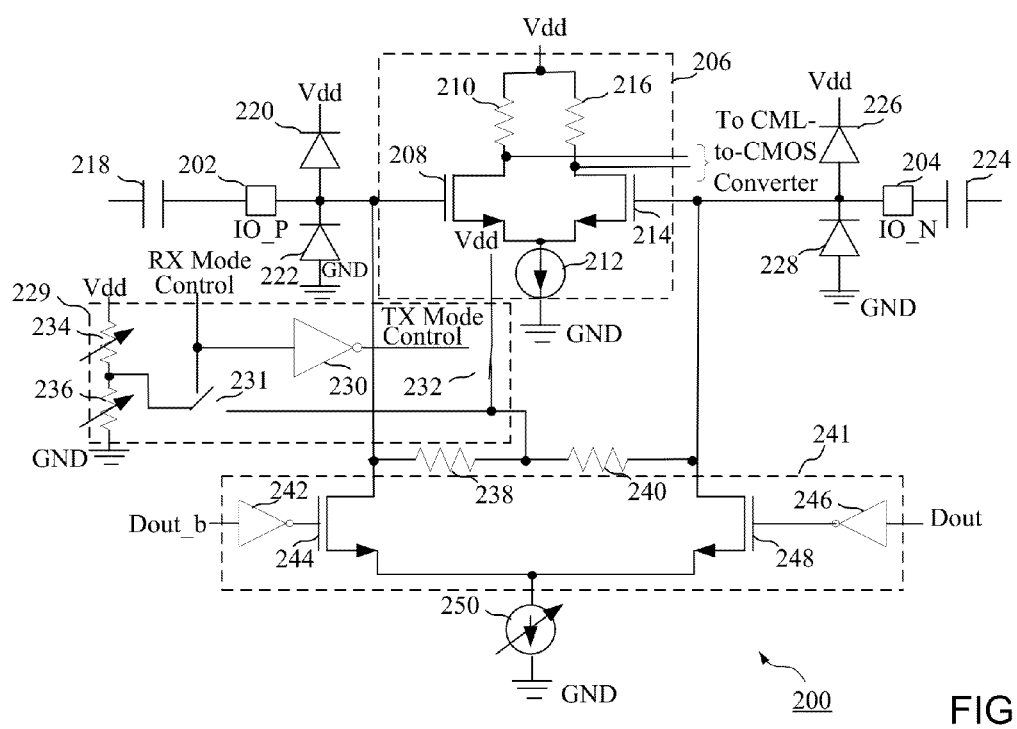
FIG. 4 is a block diagram showing the implementation of the input/output circuit of FIG. 2 configured to transmit signals.

In the transmit mode as shown in FIG. 4, the switch 232 gated by TX Mode Control signal is closed and the switch 231 gated by RX Mode Control signal opens, effectively forming a CML output driver with 50 ohms load resistance for each leg of the differential pair. The transistors 244 and 248 of the transmit driver circuit 241 are preferably thin-oxide low voltage transistors to support a large CML swing, where the output swing of the signal at the input/output pads 202 and 204 depends upon the current of the current source and the voltage drop cross resistors 238 and 240, respectively. In the transmit mode, the voltage at to input/output pads may swing between Vdd and Vdd-IR, where I is the current generated by the current source 250 and R is the resistance of resistor 238 or 240 (depending upon whether transistor 244 or 248 is on and the current is flowing through resistor 238 or 340). The pre-driver inverters 242 and 246 are preferably skewed CMOS inverters to insure proper biasing and good common mode return loss. A triple-well process is preferably used in the CMOS transistors to improve charged device model (CDM) electrostatic discharge (ESD) protection, as will be described in reference to FIG. 9.

Figure 5:
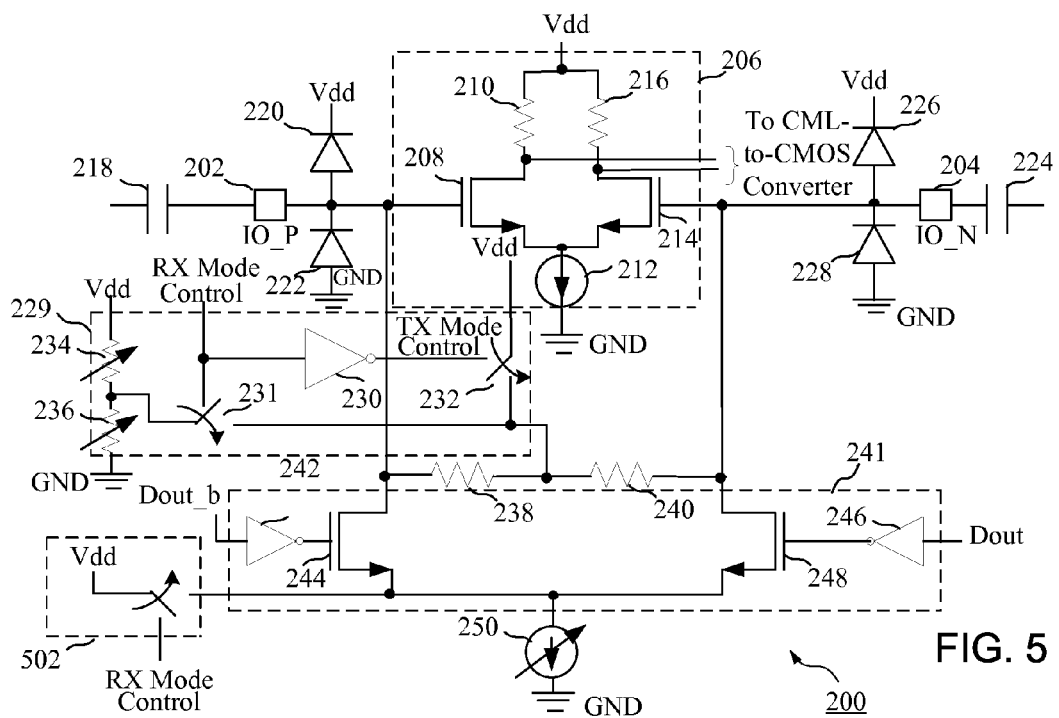
FIG. 5 is a block diagram of an input/output circuit having a protection circuit coupled to an output driver stage.

Turning now to FIG. 5, a block diagram of an input/output circuit having a protection circuit coupled to an output driver state. In particular, a protection circuit 502 is coupled to the sources of transistors 244 and 248. In the receive mode, the sources of the transistors 244 and 248 may be pulled to Vdd to mitigate gate/drain stress. During the receive mode, the input fed to the input/output pads 202 and 204 can swing to as high as 1.4 volts, for example. If the source of the transistors 244 and 248 are at ground (i.e., 0 volts), there is a 1.4 volt potential difference between the source and the drain of transistors 244 and 248. However, if the transistors 244 and 248 are thin-oxide transistors, the oxide regions cannot be subjected to voltages greater than 1.05 volts. Accordingly, during the receive mode, the protection circuit 502 will couple Vdd to the sources of transistors 244 and 248. That is, because the current source 250 is off during the receive mode and the sources of the transistors are floating, pulling the sources of the transistors to the reference voltage Vdd will reduce the potential difference between the source and drain of the transistors 244 and 248, and therefore prevent any damage to the transistors. The protection circuit 502, as well as the switches 231 and 232, could be implemented by a transistor coupled to receive the respective control mode signal at its gate to provide a path for a given voltage, where the control mode signals may be implemented by data values stored in memory elements, such as the memory elements associated with the input/output circuits of FIG. 1.

Figure 6:
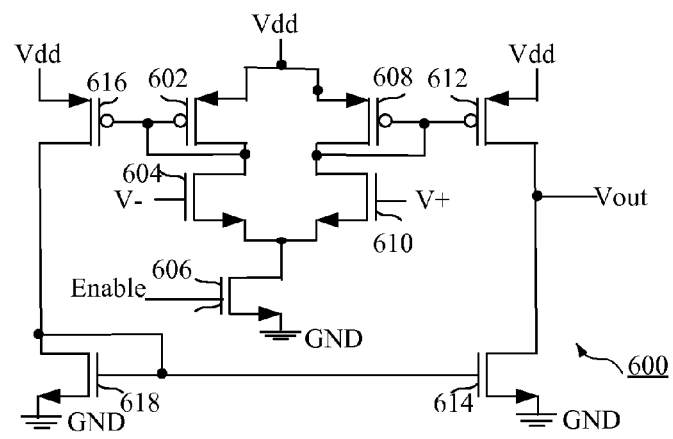
FIG. 6 is a block diagram of a CML-to-CMOS converter.

Turning now to FIG. 6, a block diagram of a CML-to-CMOS converter 600 is shown. In particular, a first input stage for receiving an input (from the differential output of the input buffer 206 of FIG. 2) comprise a transistor 602 coupled between the reference voltage Vdd and a transistor 604, which receives the first differential output V− of the differential outputs of the input buffer 206 at its gate. The source of the transistor 604 is coupled to the drain of a control transistor 606 which receives an enable signal at its gate to enable the operation of the CML-to-CMOS converter 600. A second input stage comprises a transistor 608 coupled between the reference voltage Vdd and a transistor 610, a source of which is coupled to the drain of the transistor 606. The gate of the transistor 610 is coupled to receive the second differential output V+. An output stage comprises a transistor 612 coupled between Vdd and an output node for generating an output signal Vout at the drains of the transistor 612 and a transistor 614. The gate of the transistor 612 is coupled to the gate of the transistor 608, and the gate of the transistor 614 is coupled to the drains of transistors 616 and 618 as shown. The gate of transistor 616 is coupled to the gate of transistor 602, while the gate of transistor 618 is coupled to its drain. While the circuit of FIG. 6 provides one example of a CML-to-CMOS converter, it should be understood that other circuit arrangements could be implemented to provide CML-to-CMOS conversion.

Figure 7:
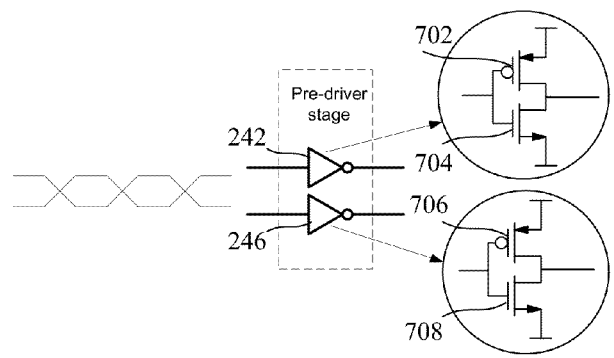
FIG. 7 is a block diagram showing a pre-driver stage of an output driver stage of FIG. 2.
Figure 8:
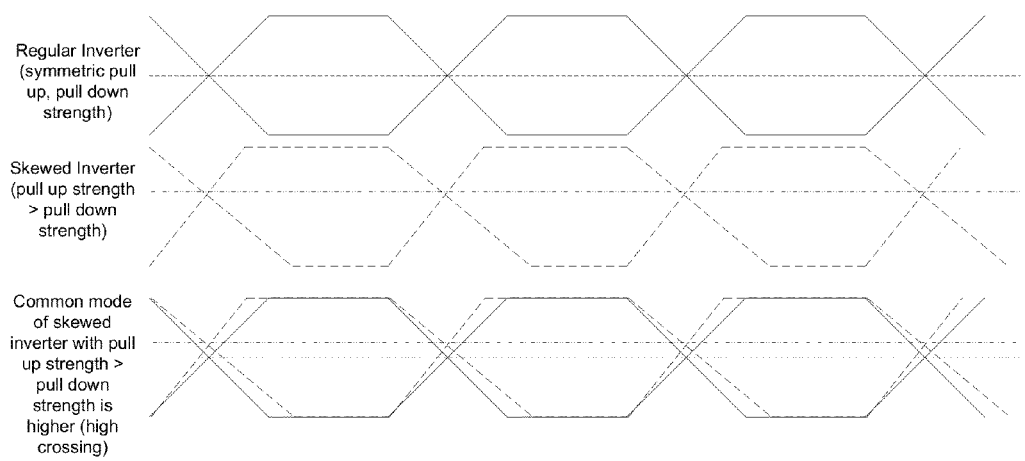
FIG. 8 is a timing diagram showing the operation of the pre-driver stage of FIG. 7.

Turning now to FIG. 7, a block diagram shows a pre-driver stage of an output driver of FIG. 2. As shown in FIG. 7, the inverter 242 is implemented as a p-channel transistor 702 coupled in series with an n-channel transistor 704. Similarly, the inverter 246 is implemented as a p-channel transistor 706 coupled in series with an n-channel transistor 708. The relative sizes of the n-channel and p-channel transistors of the inverters can be selected to provide skew. As shown in the top timing diagram of FIG. 8, a regular inverter is provided, where the transistors of the inverters have symmetric pull up and pull down strengths. The second timing diagram shown in dashed lines shows a skewed inverter, where the pull-up strength of the p-channels transistors is greater than the pull down strength of the n-channel transistors. The composite view of the two timing diagrams shows the high crossing of the skewed inverter. The strengths of the transistors can be changed by varying the dimensions of the transistors, as is well known. By providing a skewed inverter, the current source 250 is able to generate a constant output.

Figure 9:
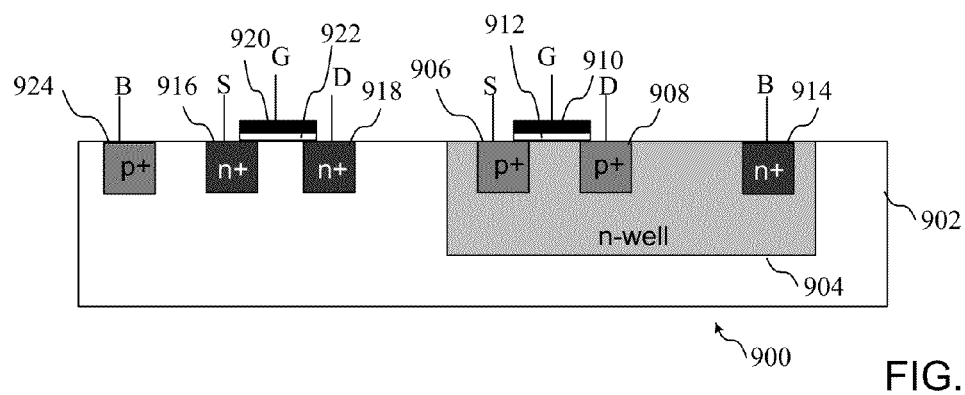
FIG. 9 is cross-sectional diagram of a CMOS inverter of the pre-driver stage.

Turning now to FIG. 9, cross-sectional diagram of a CMOS inverter 900, which may be implemented as an inverter of the pre-driver stage, is shown. The inverter of FIG. 9 is implemented in a triple-well oxide and comprises a p-type wafer 902 having an n-well 904. Transistor elements are formed in the substrate 902 and the n-well 904. In particular, a first transistor in the n-well 904 comprises a source region 906, a drain region 908 and a gate contact 910 over a gate oxide 912. A body diffusion region 914 is also provided to enable biasing the n-well 904. A second transistor in the substrate comprises a source region 916, a drain region 918 and a gate contact 920 over a gate oxide 922, as shown. A second diffusion region 924 enables biasing the substrate. The inverter of FIG. 9 which improves ESD protection is shown by way of example; it should be understood that other inverter circuits could be used.

Figure 10:
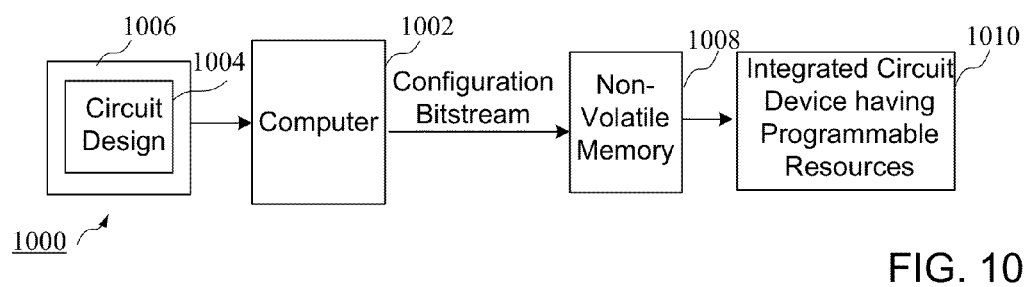
FIG. 10 is a block diagram of a system for programming a device having programmable resources.

Turning now to FIG. 10, a block diagram of a system for programming a device having programmable resources according to an implementation is shown. In particular, a computer 1002 is coupled to receive a circuit design 1004 from a memory 1006, and generates a configuration bitstream which is stored in the non-volatile memory 1006. As will be described in more detail below, the circuit design may be a high level design, such as a circuit design defined in a hardware description language (HDL). Also, the computer may be configured to run software that generates a configuration bitstream which is stored in the non-volatile memory 1008 and provided to an integrated circuit 1010 which may be a programmable integrated circuit, such as the integrated circuit described below in FIG. 10. As will be described in more detail below, bit of the configuration bitstream are used to configure programmable resources of the integrated circuit including memory elements of the input/output circuits of FIG. 1.

Figure 11:
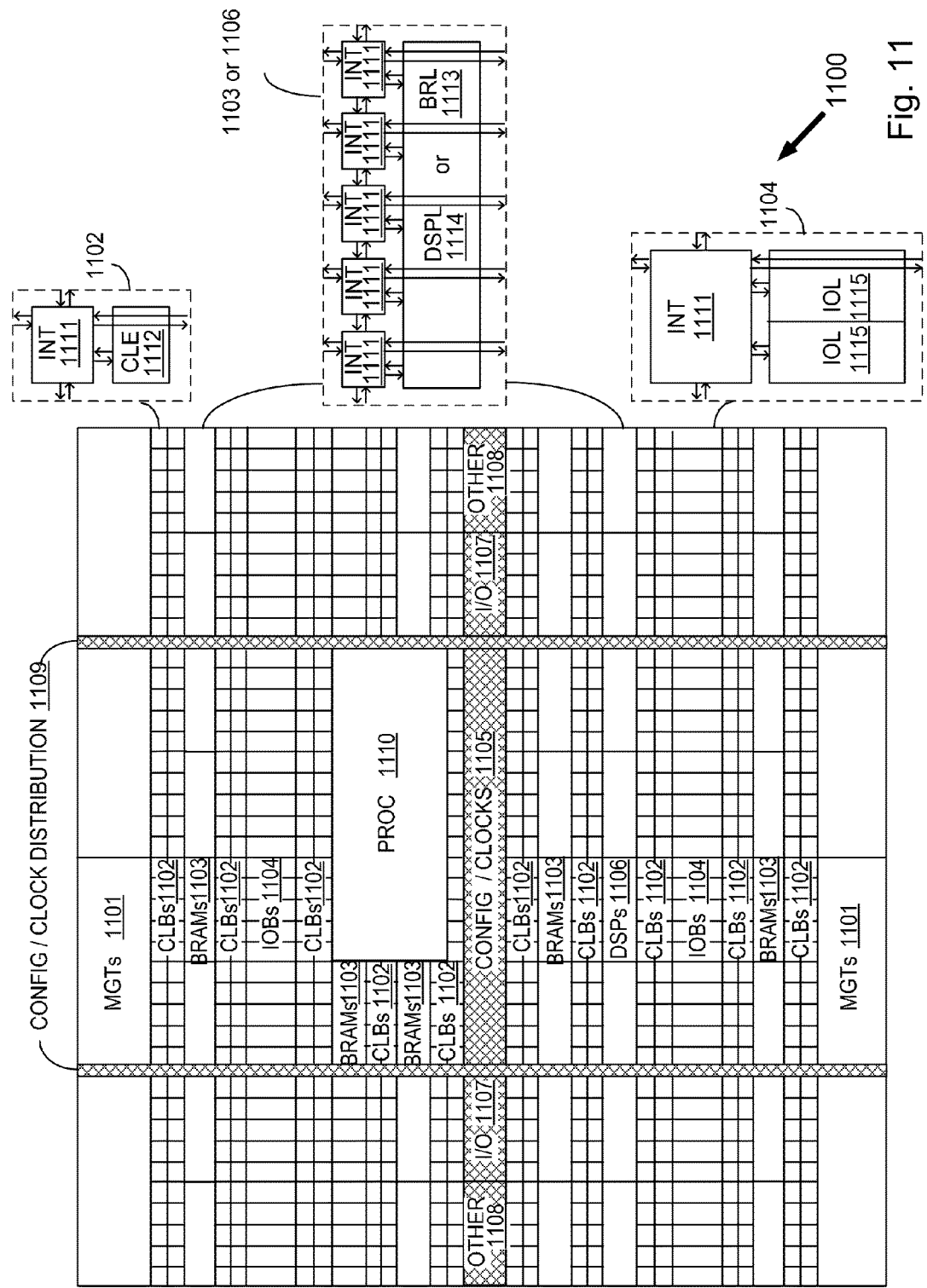
FIG. 11 is a block diagram of a device having programmable resources which may implement the circuits of FIGS. 1-9.

Turning now to FIG. 11, a block diagram of a device having programmable resources including the circuits of FIGS. 1-7 is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 11 comprises an FPGA architecture 1100 having a large number of different programmable tiles including multi-gigabit transceivers (MGTs) 1101, CLBs 1102, random access memory blocks (BRAMs) 1103, input/output blocks (IOBs) 1104, configuration and clocking logic (CONFIG/CLOCKS) 1105, digital signal processing blocks (DSPs) 1106, specialized input/output blocks (I/O) 1107 (e.g., configuration ports and clock ports), and other programmable logic 1108 such as digital clock managers, analog-to-digital converters, system monitoring logic, and so forth. Some FPGAs also include dedicated processor blocks (PROC) 1110, which may be used to implement a software application, for example.

In some FPGAs, each programmable tile includes a programmable interconnect element (INT) 1111 having standardized connections to and from a corresponding interconnect element in each adjacent tile. Therefore, the programmable interconnect elements taken together implement the programmable interconnect structure for the illustrated FPGA. The programmable interconnect element 1111 also includes the connections to and from the programmable logic element within the same tile, as shown by the examples included at the top of FIG. 11.

For example, a CLB 1102 may include a configurable logic element (CLE) 1112 that may be programmed to implement user logic plus a single programmable interconnect element 1111. A BRAM 1103 may include a BRAM logic element (BRL) 1113 in addition to one or more programmable interconnect elements. The BRAM includes dedicated memory separate from the distributed RAM of a configuration logic block. Typically, the number of interconnect elements included in a tile depends on the height of the tile. In the pictured implementation, a BRAM tile has the same height as five CLBs, but other numbers may also be used. A DSP tile 1106 may include a DSP logic element (DSPL) 1114 in addition to an appropriate number of programmable interconnect elements. An IOB 1104 may include, for example, two instances of an input/output logic element (IOL) 1115 in addition to one instance of the programmable interconnect element 1111. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured implementation, a columnar area near the center of the die is used for configuration, clock, and other control logic. The config/clock distribution regions 1109 extending from this column are used to distribute the clocks and configuration signals across the breadth of the FPGA. Some FPGAs utilizing the architecture illustrated in FIG. 11 include additional logic blocks that disrupt the regular columnar structure making up a large part of the FPGA. The additional logic blocks may be programmable blocks and/or dedicated logic. For example, the processor block PROC 1110 shown in FIG. 11 spans several columns of CLBs and BRAMs.

Note that FIG. 11 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 11 are purely exemplary. For example, in an actual FPGA more than one adjacent column of CLBs is typically included wherever the CLBs appear in order to facilitate the efficient implementation of user logic. While the implementation of FIG. 11 relates to an integrated circuit having programmable resources, it should be understood that the circuits and methods set forth in more detail below could be implemented in any type of ASIC.

Figure 12:
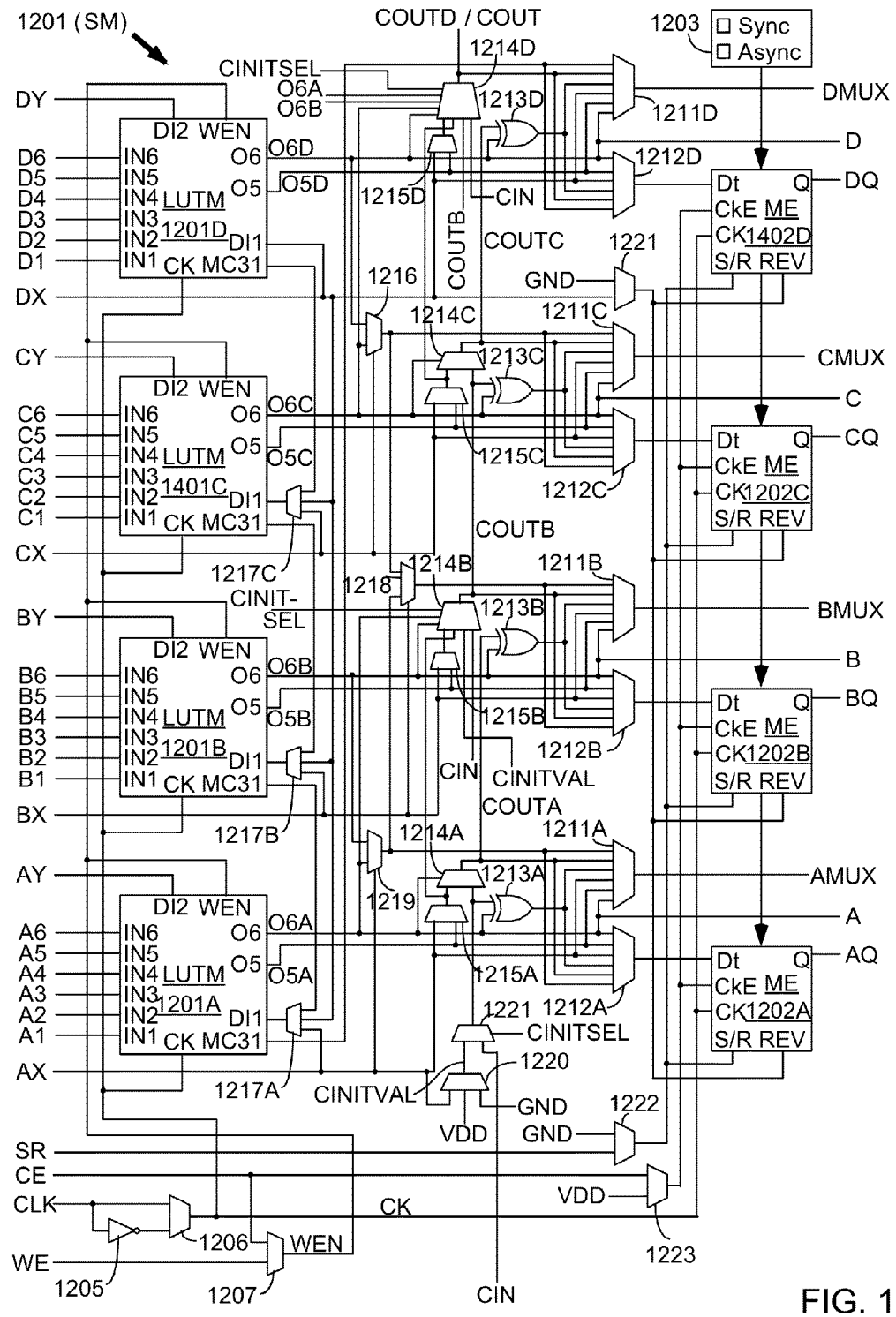
FIG. 12 is a block diagram of a configurable logic element of the device of FIG. 11.

Turning now to FIG. 12, block diagram of a configurable logic element of the device of FIG. 11 is shown. In particular, FIG. 12 illustrates in simplified form a configurable logic element of a configuration logic block 1102 of FIG. 11. In the implementation of FIG. 12, slice M 1201 includes four lookup tables (LUTMs) 1201A-1401D, each driven by six LUT data input terminals A1-A6, B1-B6, C1-C6, and D1-D6 and each providing two LUT output signals O5 and O6. The O6 output terminals from LUTs 1201A-1201D drive slice output terminals A-D, respectively. The LUT data input signals are supplied by the FPGA interconnect structure via input multiplexers, which may be implemented by programmable interconnect element 1211, and the LUT output signals are also supplied to the interconnect structure. Slice M also includes: output select multiplexers 1211A-1211D driving output terminals AMUX-DMUX; multiplexers 1212A-1212D driving the data input terminals of memory elements 1202A-1202D; combinational multiplexers 1216, 1218, and 1219; bounce multiplexer circuits 1222-1223; a circuit represented by inverter 1205 and multiplexer 1206 (which together provide an optional inversion on the input clock path); and carry logic having multiplexers 1214A-1214D, 1215A-1215D, 1220-1221 and exclusive OR gates 1213A-1213D. All of these elements are coupled together as shown in FIG. 12. Where select inputs are not shown for the multiplexers illustrated in FIG. 12, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 12 for clarity, as well as from other selected figures herein.

In the pictured implementation, each memory element 1202A-1202D may be programmed to function as a synchronous or asynchronous flip-flop or latch. The selection between synchronous and asynchronous functionality is made for all four memory elements in a slice by programming Sync/Asynch selection circuit 1203. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1202A-1202D are clocked by a clock signal CK, which may be provided by a global clock network or by the interconnect structure, for example. Such programmable memory elements are well known in the art of FPGA design. Each memory element 1202A-1202D provides a registered output signal AQ-DQ to the interconnect structure. Because each LUT 1201A-1201D provides two output signals, O5 and O6, the LUT may be configured to function as two 5-input LUTs with five shared input signals (IN1-IN5), or as one 6-input LUT having input signals IN1-IN6.

In the implementation of FIG. 12, each LUTM 1201A-1201D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1217A-1217C for LUTs 1201A-1201C), or to the two 32-bit RAMs via input terminals DI1 and DI2. RAM write operations in the LUT RAMs are controlled by clock signal CK from multiplexer 1206 and by write enable signal WEN from multiplexer 1207, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1201A may also be provided to the general interconnect structure for shift register chaining, via output select multiplexer 1211D and CLE output terminal DMUX. Accordingly, the circuits and methods set forth above may be implemented in a device such as the devices of FIGS. 11 and 12, or any other suitable device.

Figure 13:
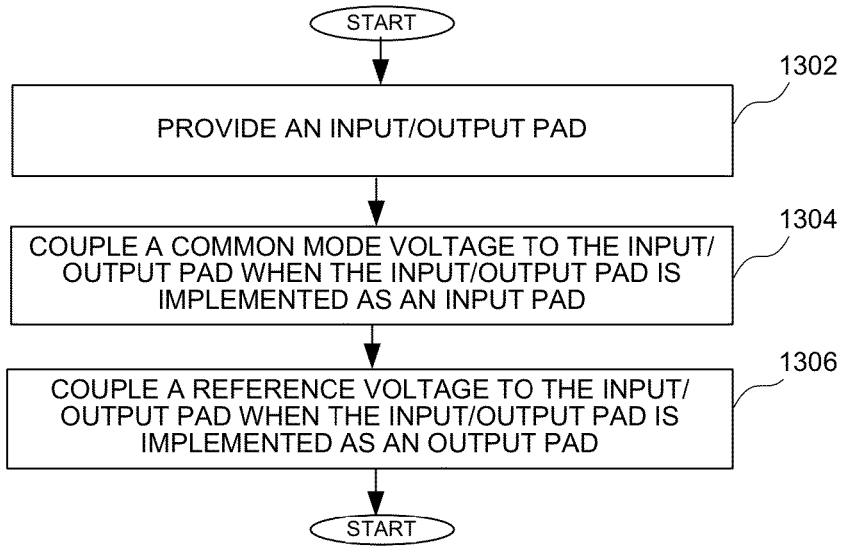
FIG. 13 is a flow chart showing a method of implementing an input/output circuit in an integrated circuit.

Turning now to FIG. 13, a flow chart shows a method of implementing an input/output circuit in an integrated circuit. In particular, an input/output pad is provided at a block 1302. A common mode voltage is coupled to the input/output pad when the input/output pad is implemented as an input pad at a block 1304. A reference voltage is coupled to the input/output pad when the input/output pad is implemented as an output pad at a block 1306.

Figure 14:
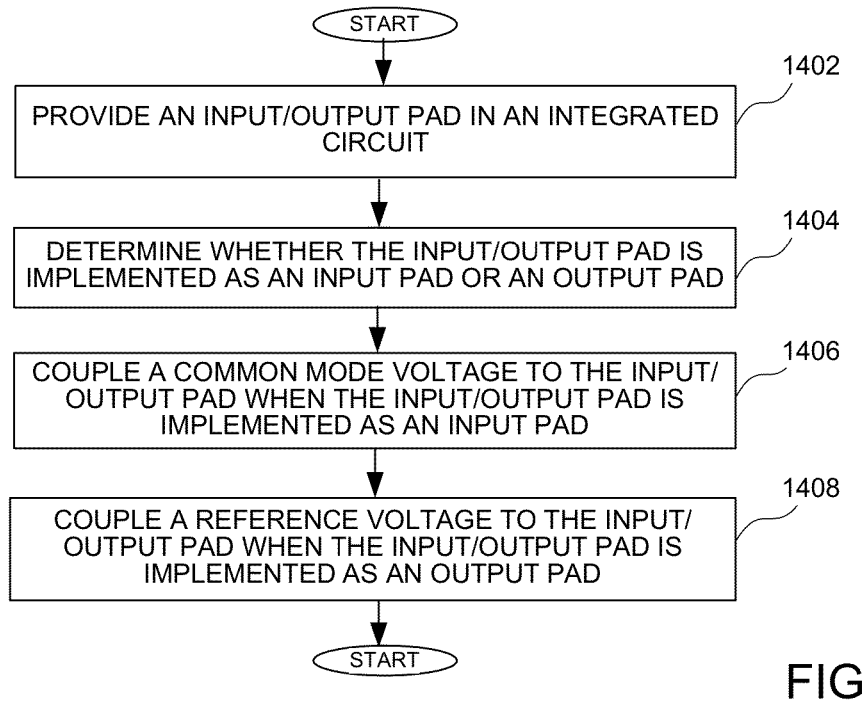
FIG. 14 is a flow chart showing another method of implementing an input/output circuit in an integrated circuit.

Turning now to FIG. 14, a flow chart shows another method of implementing an input/output circuit in an integrated circuit. An input/output pad is provided in an integrated circuit at a block 1402. It is determined whether the input/output pad is implemented as an input pad or an output pad at a block 1404. A common mode voltage is coupled to the input/output pad when the input/output pad is implemented as an input pad at a block 1406. A reference voltage is coupled to the input/output pad when the input/output pad is implemented as an output pad at a block 1408.

Figure 15:
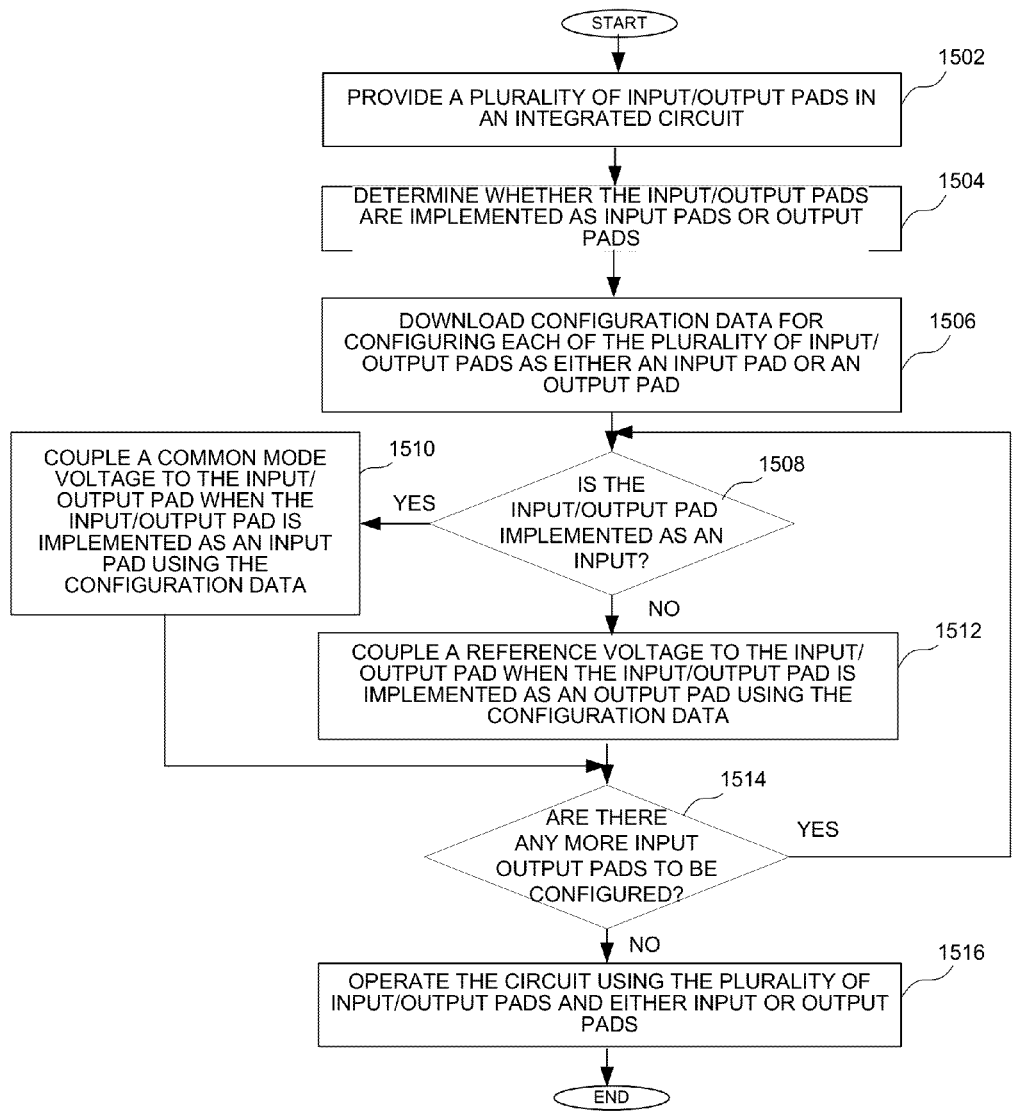
FIG. 15 is a flow chart showing a method of implementing an integrated circuit having a plurality of input/output circuits.

Turning now to FIG. 15, a flow chart shows a method of implementing an integrated circuit having a plurality of input/output circuits. A plurality of input/output pads is provided in an integrated circuit at a block 1502. It is determined whether the input/output pad is implemented as an input pad or an output pad at a block 1504. Configuration data for configuring each of the plurality of input/output pads as either an input pad or an output pad is download to the integrated circuit at a block 1506. It is then determined whether the input/output pad implemented as an input at a block 1508. If so, a common mode voltage is coupled to the input/output pad when the input/output pad is implemented as an input pad using the configuration data at a block 1510. If not, a reference voltage is coupled to the input/output pad when the input/output pad is implemented as an output pad using the configuration data at a block 1512. It is then determined whether there are any more input output pads to be configured at a block 1514. The circuit is then operated using the plurality of input/output pads and either input or output pads at a block 1516.

The various elements of the methods of FIGS. 13-15 may be implemented using the circuits of FIGS. 1-12 as described, or using some other suitable circuits. While specific elements of the method are described, it should be understood that additional elements of the method, or additional details related to the elements, could be implemented according to the disclosure of FIGS. 1-13.

It can therefore be appreciated that new methods of and devices for implementing an input/output circuit in an integrated circuit has been described. It will be appreciated by those skilled in the art that numerous alternatives and equivalents will be seen to exist which incorporate the disclosed invention. As a result, the invention is not to be limited by the foregoing implementations, but only by the following claims.

What is claimed is:

1. An input/output circuit implemented in an integrated circuit, the input/output circuit comprising:
   a first input/output pad;
   a voltage control circuit coupled to the first input/output pad; and
   a second input/output pad, wherein the second input/output pad is coupled to the voltage control circuit;
   wherein the voltage control circuit sets a voltage at the first input/output pad at a first voltage when the first input/output pad is implemented as an input pad and at a second voltage when the first input/output pad is implemented as an output pad.

2. The input/output circuit of claim 1, wherein the voltage control circuit couples a common mode voltage to the first input/output pad when the first input/output pad is implemented as an input pad.

3. The input/output circuit of claim 2, wherein the common mode voltage is a programmable common mode voltage.

4. The input/output circuit of claim 2, wherein the voltage control circuit comprises a resistor divider circuit having a variable resistor to set the common mode voltage.

5. The input/output circuit of claim 1, wherein the voltage control circuit is configured to receive a control signal and to set, in response to the control signal, the voltage at the first input/output pad either at the first voltage when the first input/output pad is implemented as an input pad to receive an input signal in a receive mode or at the second voltage when the first input/output pad is implemented as an output pad to transmit an output signal in a transmit mode.

6. The input/output circuit of claim 1, further comprising an input buffer coupled to the first input/output pad and the second input/output pad.

7. The input/output circuit of claim 6, further comprising a CML-to-CMOS circuit coupled to output nodes of the input buffer.

8. An input/output circuit implemented in an integrated circuit, the input/output circuit comprising:
   a first input/output pad;
   a first switch coupled to a common mode voltage, the first switch enabling coupling the common mode voltage to the first input/output pad when the first input/output pad is implemented as an input pad; and
   a second switch coupled to a reference voltage, the second switch coupling the reference voltage to the first input/output pad when the first input/output pad is implemented as an output pad;
   wherein the first switch is controlled by a first memory element and the second switch is controlled by a second memory element.

9. The input/output circuit of claim 8, further comprising a resistor divider having a variable resistor, wherein the common mode voltage is set by the resistor divider.

10. The input/output circuit of claim 8, further comprising a voltage control circuit comprising the first switch and the second switch, wherein the voltage control circuit is configured to receive a control signal and to set, in response to the control signal, a voltage at the first input/output pad either at a first voltage when the first input/output pad is implemented as an input pad to receive an input signal in a receive mode or at a second voltage when the first input/output pad is implemented as an output pad to transmit an output signal in a transmit mode.

11. The input/output circuit of claim 8, further comprising a second input/output pad, wherein the second input/output pad is coupled to the common mode voltage when the second input/output pad is implemented as an input pad.

12. The input/output circuit of claim 11, further comprising an input buffer coupled to the first input/output pad and the second input/output pad.

13. The input/output circuit of claim 11, further comprising an output driver stage coupled to the first input/output pad and the second input/output pad.

14. The input/output circuit of claim 13, further comprising a protection circuit coupled to the output driver stage, the protection circuit reducing stress on drive transistors of the output driver stage.

15. A method of implementing an input/output circuit in an integrated circuit, the method comprising:
 providing a first input/output pad;
 coupling a common mode voltage to the first input/output pad when the first input/output pad is implemented as an input pad;
 coupling a reference voltage to the first input/output pad when the first input/output pad is implemented as an output pad; and
 providing a second input/output pad, wherein the second input/output pad is coupled to the common mode voltage when the second input/output pad is implemented as an input pad.

16. The method of claim 15, wherein coupling a common mode voltage to the first input/output pad comprises coupling a programmable common mode voltage.

17. The method of claim 15, wherein the coupling a common mode voltage or a reference voltage is based upon data in at least one memory element.

18. The method of claim 15, further comprising setting, in response to a control signal, a voltage at the first input/output pad either at a first voltage when the first input/output pad is implemented as an input pad to receive an input signal in a receive mode or at a second voltage when the first input/output pad is implemented as an output pad to transmit an output signal in a transmit mode.

19. The method of claim 15, further comprising coupling an input buffer to the first input/output pad and the second input/output pad.

20. The input/output circuit of claim 19, further comprising coupling a CML-to-CMOS circuit to output nodes of the input buffer.

* * * * *